(12) United States Patent
Charbonneau-Lefort et al.

(10) Patent No.: US 11,646,384 B2
(45) Date of Patent: May 9, 2023

(54) OPTOELECTRONIC DEVICES WITH NON-RECTANGULAR DIE SHAPES

(71) Applicant: Apple Inc., Cupertino, CA (US)

(72) Inventors: Mathieu Charbonneau-Lefort, San Jose, CA (US); Saahil Mehra, Saratoga, CA (US); Tongbi T. Jiang, Santa Clara, CA (US); Saijin Liu, San Jose, CA (US)

(73) Assignee: Apple Inc., Cupertino, CA (US)

(\*) Notice: Subject to any disclaimer, the term of this patent is extended or adjusted under 35 U.S.C. 154(b) by 16 days.

(21) Appl. No.: 17/174,076

(22) Filed: Feb. 11, 2021

(65) Prior Publication Data
US 2022/0254941 A1  Aug. 11, 2022

(51) Int. Cl.
*H01L 31/0352* (2006.01)
*H01L 31/0203* (2014.01)
*H01L 31/02* (2006.01)
*H01L 25/16* (2023.01)
*H01L 25/04* (2023.01)

(52) U.S. Cl.
CPC .... *H01L 31/035281* (2013.01); *H01L 25/167* (2013.01); *H01L 31/0203* (2013.01); *H01L 31/02005* (2013.01); *H01L 25/042* (2013.01)

(58) Field of Classification Search
CPC ........ H01L 25/167; H01L 21/70; H01L 21/71
See application file for complete search history.

(56) References Cited

U.S. PATENT DOCUMENTS

| | | | |
|---|---|---|---|
| 10,121,948 B2* | 11/2018 | Hayashi | H01L 33/62 |
| 11,063,183 B2* | 7/2021 | Emura | H01L 33/387 |
| 2015/0000726 A1* | 1/2015 | Huang | H02S 20/00 |
| | | | 136/251 |
| 2015/0179894 A1* | 6/2015 | Herner | H01L 33/0095 |
| | | | 257/89 |
| 2019/0090766 A1* | 3/2019 | Block | A61B 5/0295 |
| 2021/0005777 A1* | 1/2021 | Inoue | H01L 33/0093 |

\* cited by examiner

*Primary Examiner* — Matthew L Reames
(74) *Attorney, Agent, or Firm* — Aikin & Gallant, LLP

(57) ABSTRACT

An optoelectronic module may include one or more non-rectangular optoelectronic dies e.g., light emitting diodes and photodiodes, arranged to maximize the usage of surface area when mounted to a base circuit board. Multi-axis and non-orthogonal axis dicing processes can be used to form the dies which have non-rectangular shapes.

15 Claims, 16 Drawing Sheets

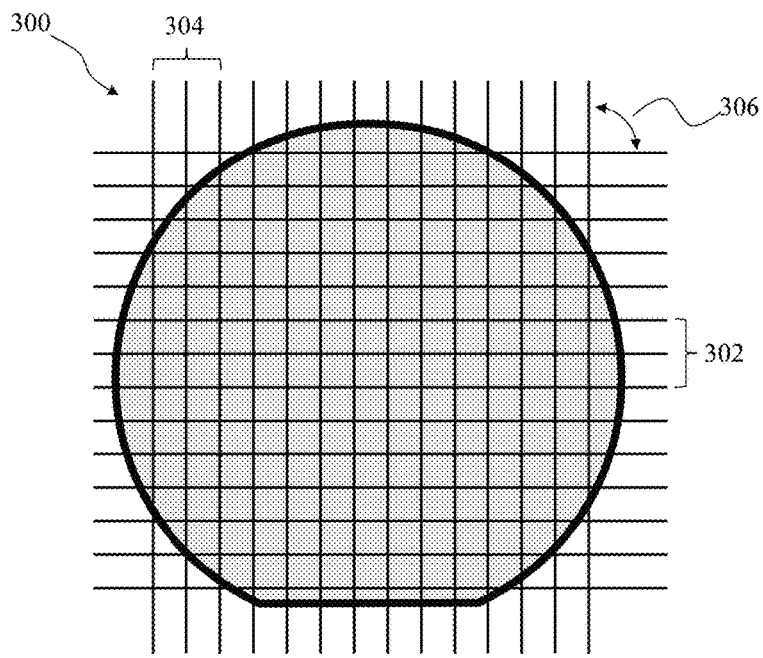
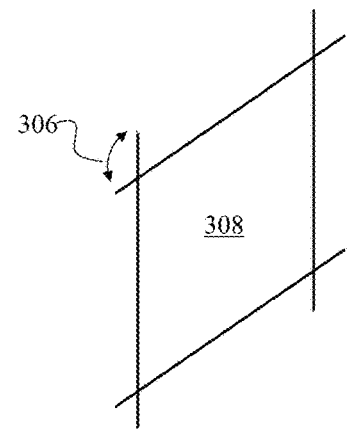
*FIG. 14A (Related Art)*  *FIG. 14B*
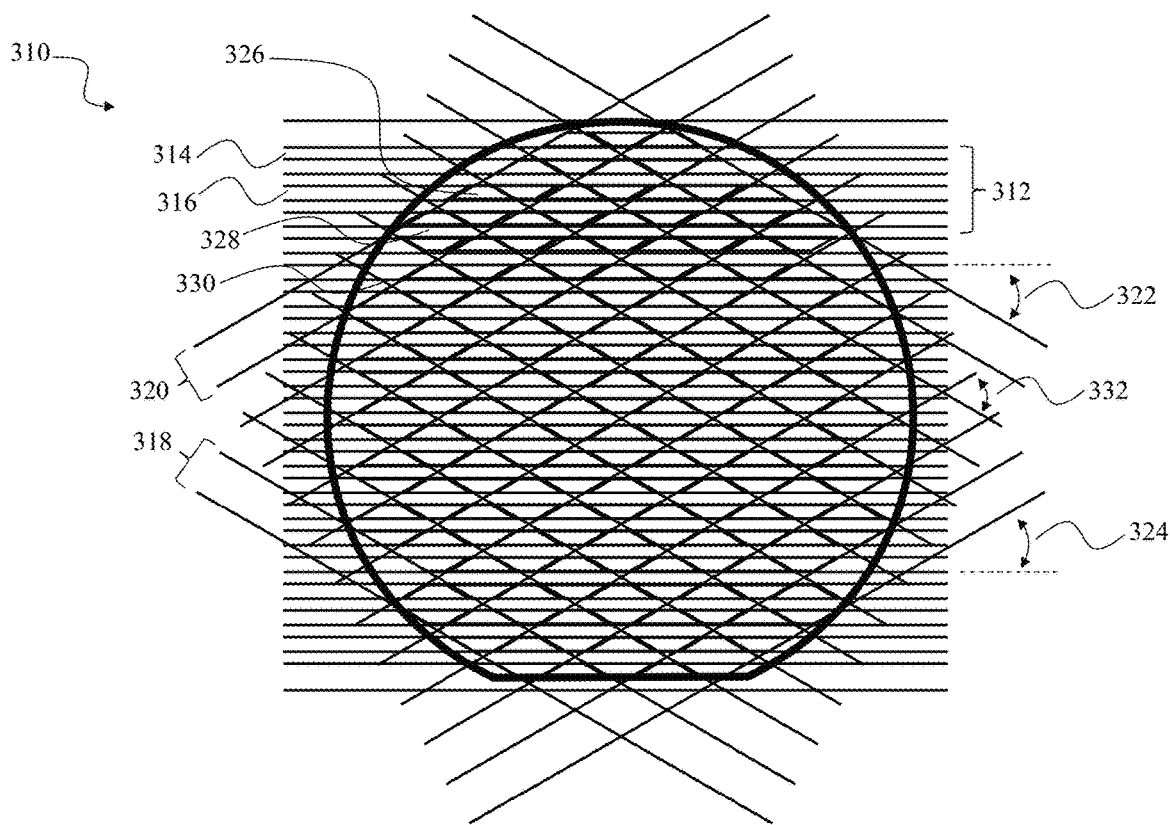
*FIG. 15*

OPTOELECTRONIC DEVICES WITH NON-RECTANGULAR DIE SHAPES

BACKGROUND

Field

Embodiments described herein relate to optoelectronic devices. More specifically, embodiments described herein relate to non-rectangular optoelectronic devices and methods of manufacture.

Background Information

Nearly all optoelectronic (light-emitting or light-detecting) semiconductor dies (light emitting diodes (LEDs), photodiodes, lasers, phototransistors, vertical surface cavity emitting lasers (VCSELs), etc.) that are used to build optical modules are rectangular in shape. Typically, "scribe-and-break" and blade dicing technologies are used to singulate each individual rectangular device (die) from a full semiconductor wafer. The design reasons why dies are rectangular shaped are primarily due to wafer utilization considerations and cost pressure to maintain a simple dicing process, while maintaining a high yield.

Traditional optical modules used in sensing applications or as telecommunication and/or data communication transceivers typically contain only a few (e.g., less than four) unique optoelectronic devices. In these cases, the optical module is designed, built, and optimized around industry-standard rectangular die shapes.

Wearable electronic devices, including electronic watches, have been outfitted with sensors of various sorts, including health sensors which can collect data representative of one or more aspects of the wearer's health. Such wearable electronic devices have proved useful, but may benefit from improved sensitivity and versatility.

SUMMARY

Optoelectronic modules are described in which non-rectangular shaped dies may be integrated into one or more emitter assemblies and detector assemblies. Additionally, various wafer processing methods are described to facilitate the formation and integration of the non-rectangular shaped dies.

In an embodiment, an optoelectronic module includes a base with a top surface including a plurality of bond pads. An isolation barrier is arranged over the top surface such that an opening though the isolation barrier is over the plurality of bond pads. A plurality of non-rectangular shaped dies is mounted on the plurality of bond pads, and laterally adjacent sidewalls of the opening. The non-rectangular shaped dies may be optoelectronic dies such as light emitting diodes (LEDs) for integration into an emitter assembly and/or photodiodes for integration into a detector assembly. In some embodiments a plurality of non-rectangular shaped dies is arranged in a pattern, such as a ring pattern, within the opening.

BRIEF DESCRIPTION OF THE DRAWINGS

The invention of the present disclosure will now be described in more detail with reference to exemplary embodiments of the apparatus and method, given only by way of example, and with reference to the accompanying drawings, in which:

FIG. 14A illustrates a top plan view of a prior wafer cutting pattern which produces rectangular dies;

FIG. 14B illustrates a top plan view of an embodiment of a wafer cutting pattern which produces non-rectangular dies;

FIG. 15 illustrates a top plan view of a first embodiment of a wafer cutting pattern incorporating multi-axis wafer dicing to produce non-rectangular dies;

DETAILED DESCRIPTION

Figure 1:
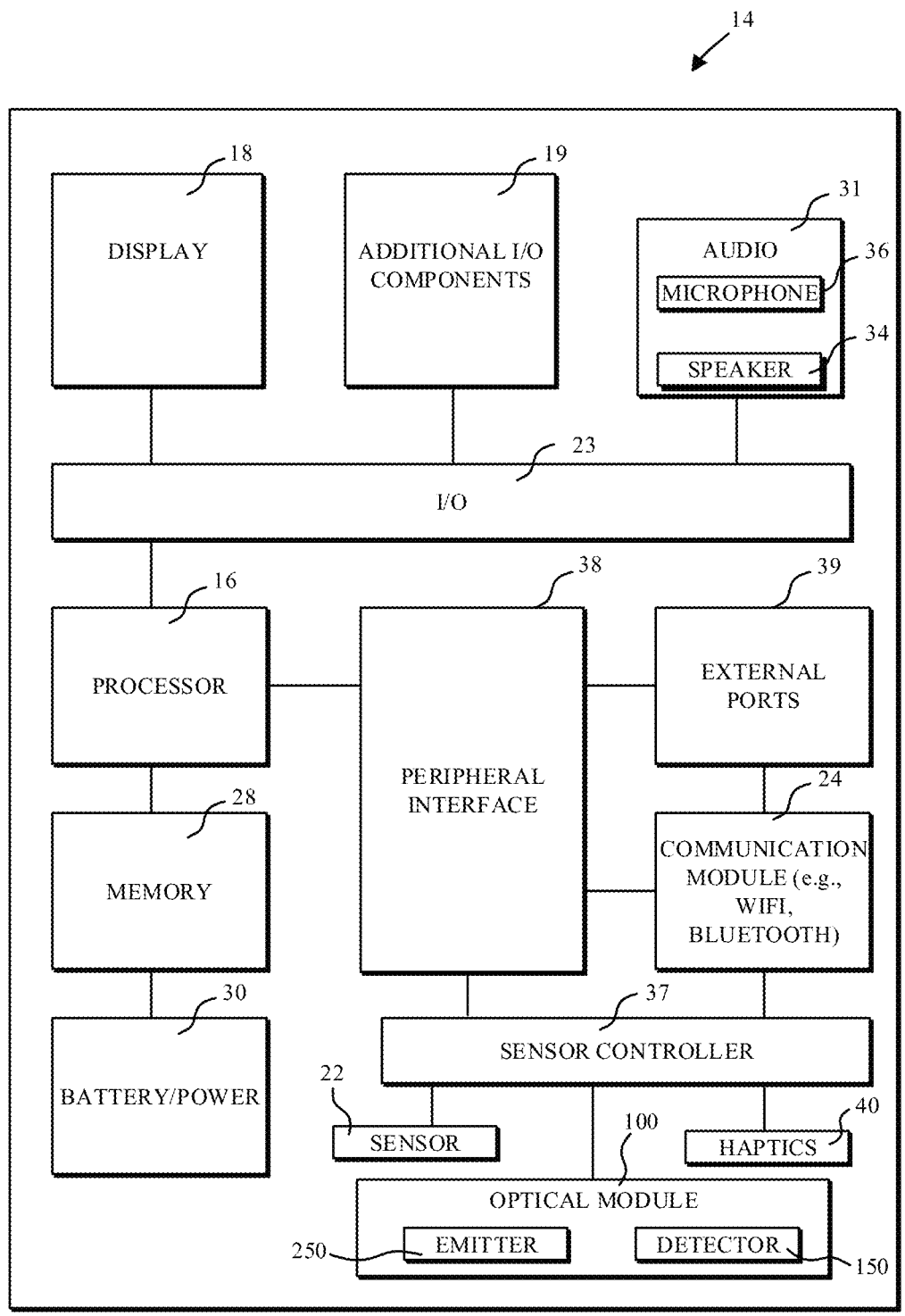
FIG. 1 illustrates a system diagram of a portable electronic device in accordance with an embodiment.

Referring to the drawing figures, like reference numerals designate identical or corresponding elements throughout the several figures.

Embodiments describe non-rectangular dies and processes of producing them. In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., to provide a thorough understanding of the embodiments. In other instances, well-known processes and manufacturing techniques have not been described in particular detail to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The singular forms "a," "an," and "the" include plural referents unless the context clearly dictates otherwise. Thus, for example, reference to "a die" includes reference to one or more of such dies, and reference to "the die" includes reference to one or more of such dies.

In one aspect it has been observed that it may be highly desirable to maximize component packing density, and thus overall sensor performance, by packaging a large number (e.g., 10-20) of optoelectronic devices as well as active/passive optical components as tightly as possible within an optical module. Component packing inefficiency due to conventional rectangular die shapes bounds the best achievable sensor performance, because rectangular devices require sparse packing of optoelectronic components, resulting in smaller die active areas and reduced light outputs/collection efficiencies. The rectangular shapes of individual die limit the minimum distance between two devices, prevents the placement of devices in a close-packed geometry, and constrains the maximum achievable die size.

In one aspect, embodiments herein describe non-rectangular die shapes which may enable sensor optical designs and technologies and, when creatively designed, processed at high wafer utilizations and/or yields. The dies may be optoelectronic devices, e.g., LEDs, photodiodes, lasers, photo transistors, and/or VCSELs, with non-rectangular shapes; however, the dies may be other microelectronic devices and are not limited to being optoelectronic devices. New die architectures such as those described herein may allow maximization of the die area and enable flexible device placement within an optoelectronic, e.g., sensor, module. For example, trapezoid-shaped dies allow placement of such devices close together in a circular geometry and octagon-shaped dies allow a significant increase in the die areas when a die must fit inside a circle. This circular constraint is common in today's consumer products, which is why a non-rectangular die shape may be uniquely beneficial.

By way of a non-limiting example of an optical sensor module, given a fixed optoelectronic module size, maximizing the photodiode and LED die active area may increase the received signal level, which may lead to an increase in sensor performance. For a fixed die area, flexible die placement and higher device packing density allows a reduction of module area, which may enable space savings in the module as a whole. For example, an estimated approximately 15% collection efficiency improvement may be achieved using non-rectangular photodiodes when compared to rectangular photodiodes.

Many die shapes can be fabricated using extensions of traditional established processes. While rectangular die shapes are obtained by dicing the wafer along two perpendicular axes, as described elsewhere herein, trapezoids, octagons, hexagonal diamonds, and triangles can be fabricated using cuts along three axes. Processes described herein may also circumvent many of the cost constraints and wafer utilization concerns associated with non-rectangular shapes. Other shapes, including circles, circle segments, and arcs can be fabricated using, for example, dry etching.

FIG. 1 illustrates a system diagram for an embodiment of a portable electronic device 14 including an optical module 100 described herein. The portable electronic device 14 includes a processor 16 and memory 28 for managing the system and executing instructions. The memory includes non-volatile memory, such as flash memory, and can additionally include volatile memory, such as static or dynamic random access memory (RAM). The memory 28 can additionally include a portion dedicated to read only memory (ROM) to store firmware and configuration utilities.

The system also includes a power module 30 (e.g., flexible batteries, wired or wireless charging circuits, etc.), a peripheral interface 38, and one or more external ports 39 (e.g., Universal Serial Bus (USB), HDMI, Display Port, and/or others). In one embodiment, the portable electronic device 14 includes a communication module 24 configured to interface with the one or more external ports 39. For example, the communication module 24 can include one or more transceivers functioning in accordance with IEEE standards, 3GPP standards, or other communication standards, and configured to receive and transmit data via the one or more external ports 39. The communication module 24 can additionally include one or more WWAN transceivers configured to communicate with a wide area network including one or more cellular towers, or base stations to communicatively connect the portable electronic device 14 to additional devices or components. Further, the communication module 24 can include one or more WLAN and/or WPAN transceivers configured to connect the portable electronic device 14 to local area networks and/or personal area networks, such as a Bluetooth network.

The electronic device 14 can further include a sensor controller 37 to manage input from one or more ambient sensors 22 such as temperature sensor, pressure sensor, humidity sensor, magnet, etc. The sensor controller 37 may additionally be connected to one or more haptics devices 40 such as a gyroscope, accelerometer, proximity sensor, ambient light sensor, infrared transceiver, etc. configured to provide force feedback, vibratory feedback, tactile sensations, etc. In accordance with embodiments, the sensor controller 37 can additionally be connected to an optical module 100, including one or more (photo) emitters assemblies 250 and one or more (photo) detector assemblies 150. For example, the optical module may be a health sensor such as a pulse sensor, an oximetry sensor, or both. In accordance with embodiments, the components of the electronic device may be used as sensors for detection of a variety of physical phenomena which can be correlated to, or representative of, aspects of the health of a user.

Still referring to FIG. 1, the electronic device 14 can include an audio module 31 including one or more speakers 34 for audio output and one or more microphones 36 for receiving audio. In embodiments, the speaker 34 and the microphone 36 can be piezoelectric components. The portable electronic device 14 further includes an input/output (I/O) controller 23, a display 18, and optional additional I/O components 19 (e.g., keys, buttons, dials, lights, LEDs, cursor control devices, and others). The display 18 and the additional I/O components 19 may be considered to form portions of a user interface (e.g., portions of the portable electronic device 14 associated with presenting information to the user and/or receiving inputs from the user).

Figure 2A:
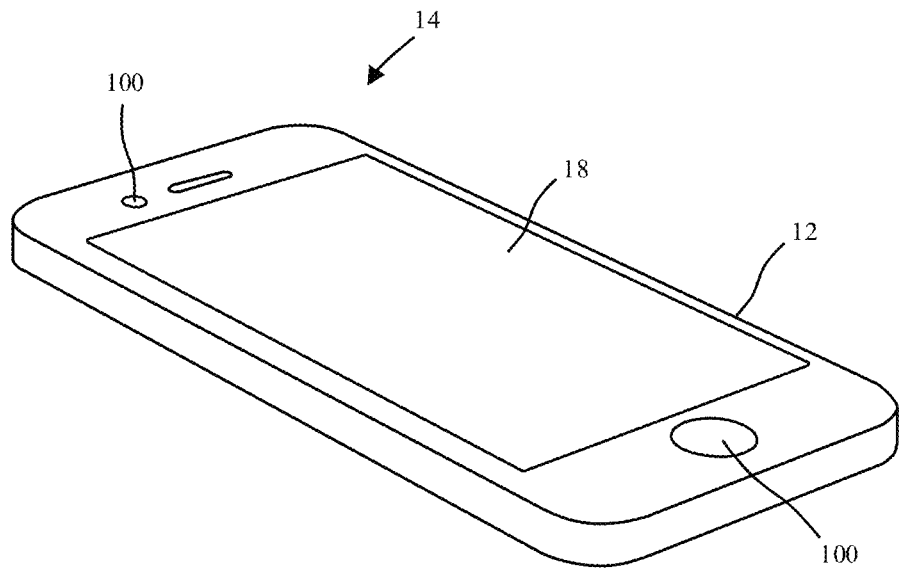
FIG. 2A illustrates isometric view of a mobile telephone in accordance with an embodiment.
Figure 2B:
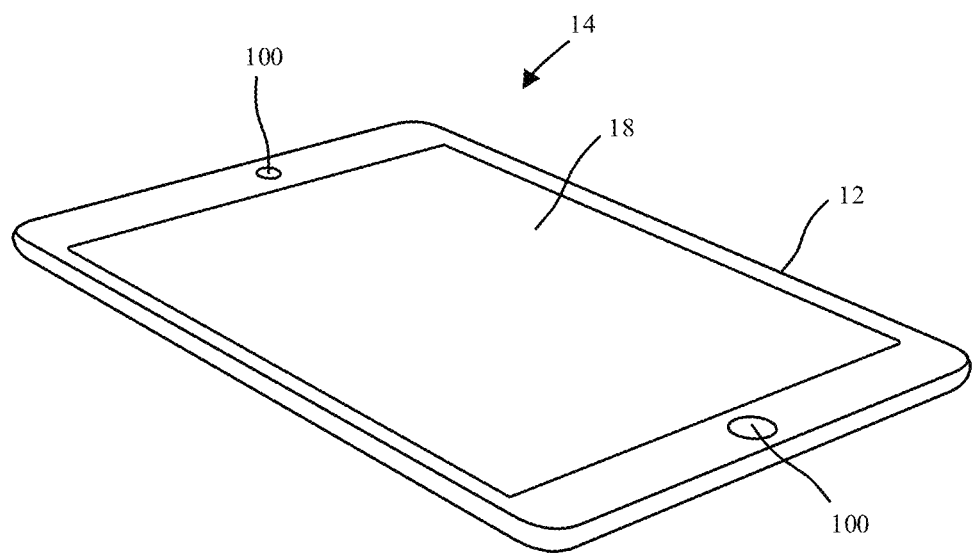
FIG. 2B illustrates an isometric view of a tablet computing device in accordance with an embodiment.
Figure 2C:
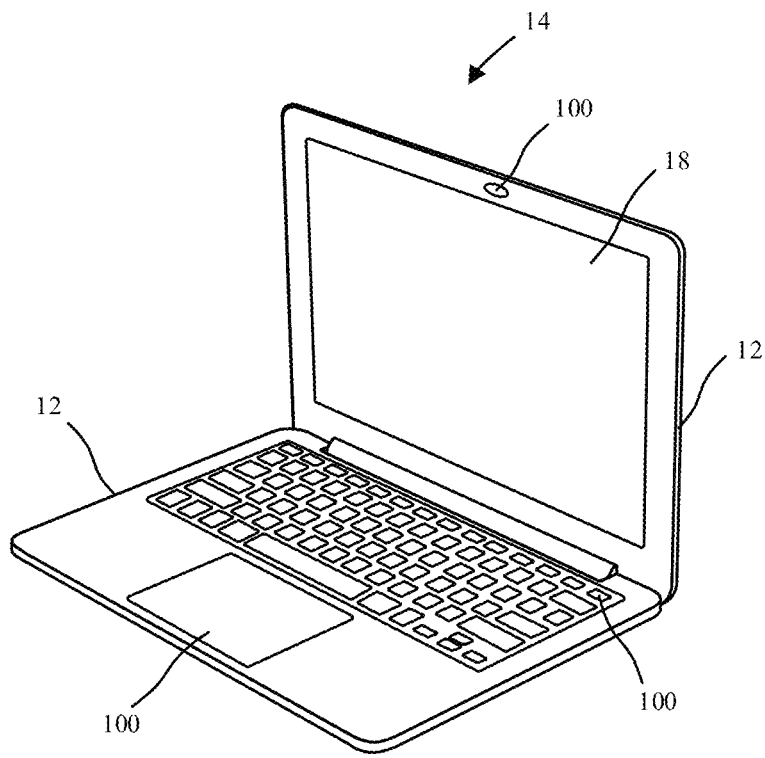
FIG. 2C illustrates an isometric view of a laptop computer in accordance with an embodiment.
Figure 2D:
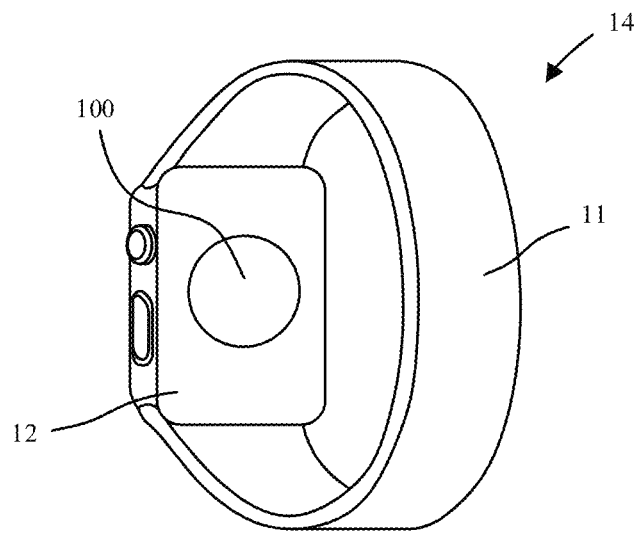
FIG. 2D illustrates an isometric view of a wearable device in accordance with an embodiment.

FIGS. 2A-2D illustrate various portable electronic devices 14 in which the various embodiments can be implemented. FIG. 2A illustrates an exemplary mobile telephone that includes a display 18 screen and one or more optical modules 100 packaged in a housing 12. The optical modules 100 may be located anywhere in the electronic device, inclusive of a touch button. FIG. 2B illustrates an exemplary tablet computing device that includes a display 18 screen and one or more optical modules 100 packaged in a housing 12. FIG. 2C illustrates an exemplary laptop computer that includes a display 18 screen and one or more optical modules 100 packaged in a housing 12. For example, the optical modules 100 may be located in a touch pad, key, touch bar, and panel including a display 18 screen, for example. FIG. 2D illustrates the back side of an exemplary wearable device that includes one or more optical modules 100 packaged in a housing 12.

Figure 3:
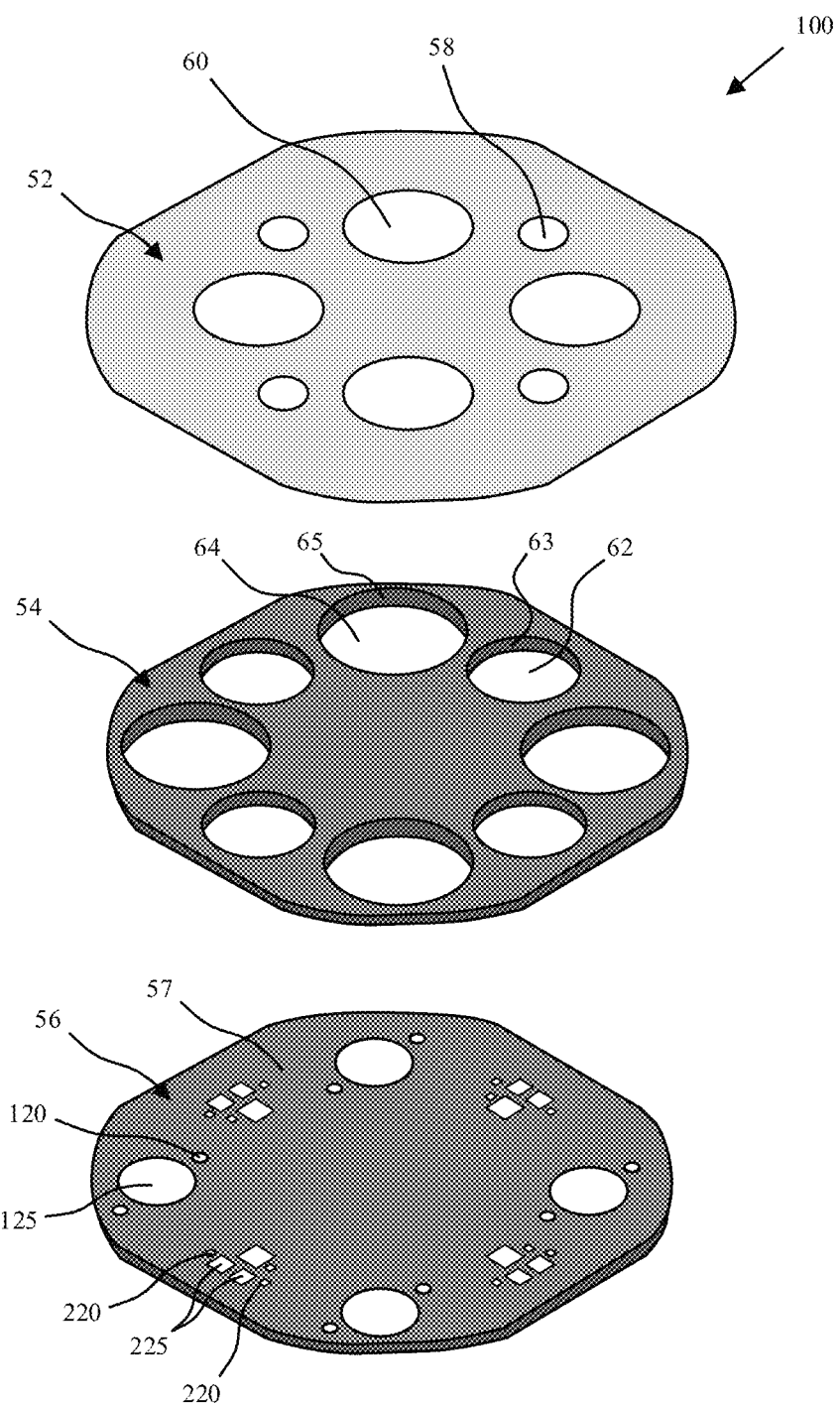
FIG. 3 illustrates an exploded view of an optical module stack up in accordance with an embodiment.

Turning now to FIG. 3, an exploded view of an optoelectronic module 100 stack up is illustrated. As shown, the optical module 100 may include a cover 52, an isolation barrier 54, and a base 56 such as a printed circuit board (PCB). The cover 52 may overly the isolation barrier 54, which in turn may overly the PCB, as suggested by their relative vertical placement in FIG. 3. The cover 52 may optionally include one or a plurality of first windows 58 (e.g. holes or other optical apertures) and may include one or a plurality of second windows 60 (e.g. holes or other optical apertures). In an embodiment, the first windows 58 and the second windows 60 are circular. First windows 58 may be sized and located to overly one or more LED assemblies, and second windows 60 may be sized and located to overly one or more photodiode assemblies, all described in greater detail elsewhere herein. Windows 58 and/or 60 may themselves be sealed or covered by an optically transparent element, lens, etc. According to some embodiments, first windows 58 are positioned between second windows 60 in a roughly circular arrangement, that is, a single circle may be drawn over all the first windows and the second windows together. In embodiments, cover 52 may be part of an outer enclosure of a device in which the optoelectronic module 100 is incorporated, e.g., those described with reference to FIGS. 2A-2D.

The isolation barrier 54 is in some respects similar to cover 52, in that the isolation barrier may include one or a plurality of first openings 62 and may include one or a plurality of second openings 64. Openings 62, 64 may be formed completely through a thickness T of the isolation barrier 54, forming sidewalls 63, 65, respectively.

In accordance with embodiments, the isolation barrier 54 may have a thickness T sufficient to inhibit or mitigate light from emitter assemblies (described elsewhere herein) directly impinging on a detector assembly (also described elsewhere herein), and thus first openings 62 and second openings 64 form recesses of thickness (depth) T. The isolation barrier 54 may additionally inhibit or mitigate cross-talk between emitter assemblies. Additionally, the isolation barrier 54 may be formed of a material and/or thickness to be opaque to the operable emission spectra for the optical module 100.

First openings 62 may align vertically with first windows 58 of the cover 52, and second openings 64 may align vertically with second windows 60 of the cover. First openings 62 may be sized and located to overly one or more LEDs of an emitter assembly, and second openings 64 may be sized and located to overly one or more photodiodes of a detector assembly, all described in greater detail elsewhere herein. According to some embodiments, first openings 62 are positioned between second openings 64 in a roughly circular arrangement, that is, a single circle may be drawn over all the first openings and the second openings together.

In an embodiment, first openings 62 have a larger area than first windows 58, and second openings 64 have a larger area than the second windows 60. In this manner, area of the windows can precisely control active area of the underlying emitter assemblies and detector assemblies.

A top surface 57 of the base 56 may include one or more bottom electrode pads 125 and wire bond pads 120 to accept a corresponding one or more LEDs, and one or more bottom electrode pads 225 and wire bond pads 220 to accept a corresponding one or more photodiodes. The windows 58, 60, and openings 62, 64, and the bond pads 125, 225 for mounting the LEDs and photodiodes are mutually vertically aligned and positioned so that the LEDs can emit light through the first windows 58 and openings 62, and the photodiodes can receive light through the second windows 60 and openings 64. In some embodiments, the LEDs and photodiodes are arranged on the base 56 alternatingly in a circle in a manner similar to the positions of the windows 58, 60 and openings 62, 64.

Figure 4:
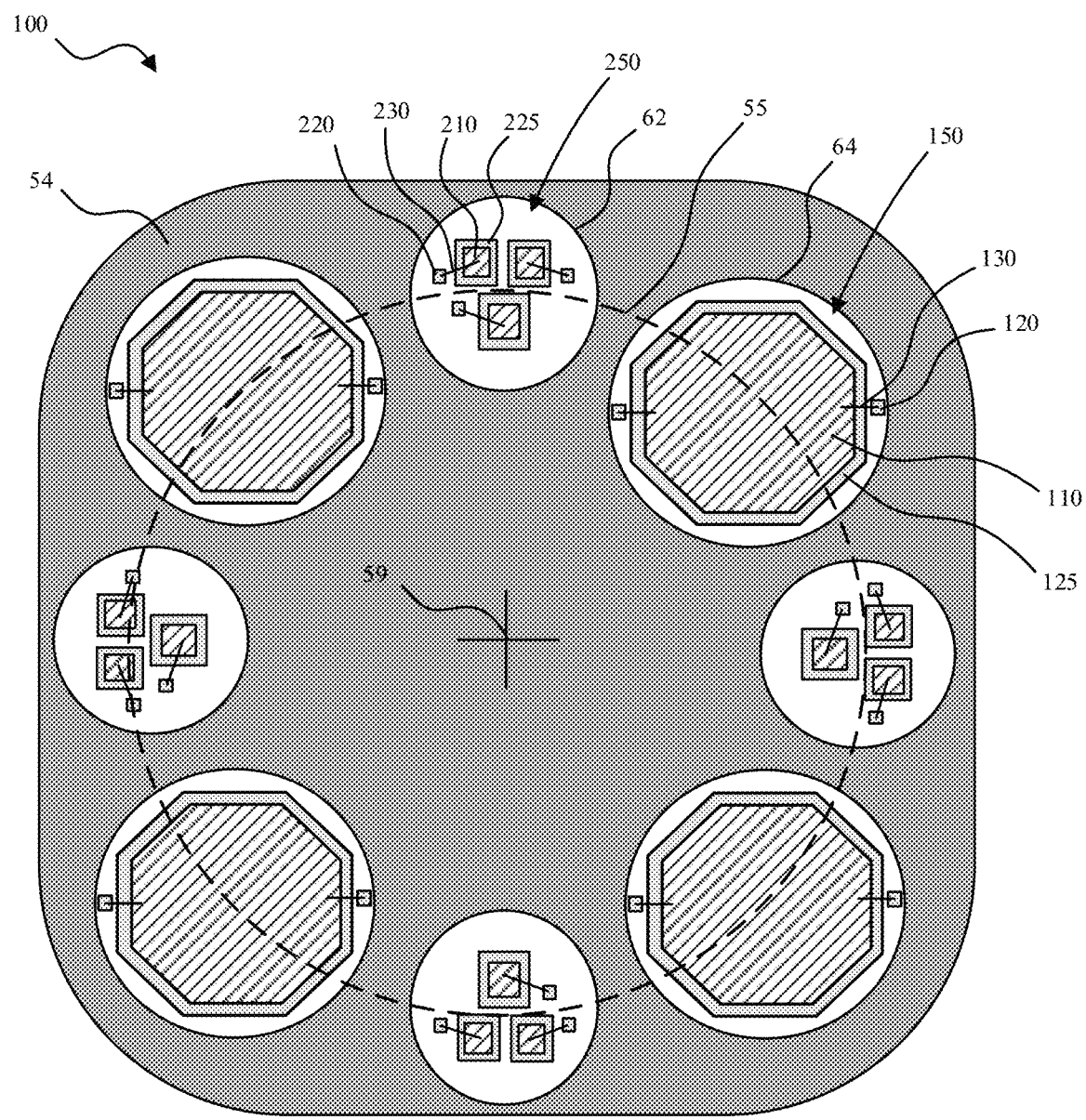
FIG. 4 illustrates a top plan view of an optoelectronic module in accordance with an embodiment.

FIG. 4 illustrates a top plan view of an example optoelectronic module 100 including mounted LEDs 210 and photodiodes 110. In embodiments, optoelectronic module 100 includes one or more non-rectangular dies (e.g. photodiodes 110 or LEDs 210) which can reduce unused area within the circular openings 62, 64 through the isolation barrier 54, thus improving performance per unit area, cost-effectiveness, or both of the optoelectronic module 100. As shown, the optical module 100 may include one or more detector assemblies 150, each including one or more photodiodes 110, and one or more emitter assemblies 250, each including one or more LEDs 210, which may emit the same or different color spectrums within the same emitter assembly 250. In the illustrated embodiment, each emitter assembly 250 includes three different LEDs 210, which can have different shapes, thickness, and emission profiles. For example, the LEDs 210 may include separate red-emitting, green-emitting, and blue-emitting LEDs 210, though this is merely exemplary and embodiments are not so limited. LEDs 210 may also or alternatively include an infrared-emitting LED. Similarly, the photodiodes 110 may be designed to absorb specific wavelength ranges. A variety of LED 210 and photodiode 110 arrangements are possible in accordance with embodiments.

In the illustrated embodiment, the photodiodes 110 are mounted onto bottom electrode pads 125, for example using a conductive bonding material such as solder. Top sides of the photodiodes may be additionally connected to wire bond pads 120 with wires 130. In this manner, a bottom side (e.g. p-side or n-side) of the photodiode is mounted/bonded to a bottom electrode pad 125, while a top side (e.g. opposite n-side or p-side) of the photodiode is electrically connected to the base with a wires 130, and wire bond pad 120. It is to be appreciated however that alternative photodiode configurations are contemplated, including those with bottom electrode pads for both p-side and n-side connection. LEDs 210 may be similarly mounted onto bottom electrode pads 225, and connected to wire bond pads 220 with wire bonds 230, or alternatively with multiple bottom electrode pads for both p-side an n-side connection.

The emitter assemblies 250 and detector assemblies 150 may, similar to the configuration of the embodiment illustrated in FIG. 3, be alternatingly arranged in a circle 55 having a center 59. Stated somewhat differently, a single circle 55 having a center 59 may be drawn over all of the emitter assemblies 250 and detector assemblies 150 together.

Figure 5:
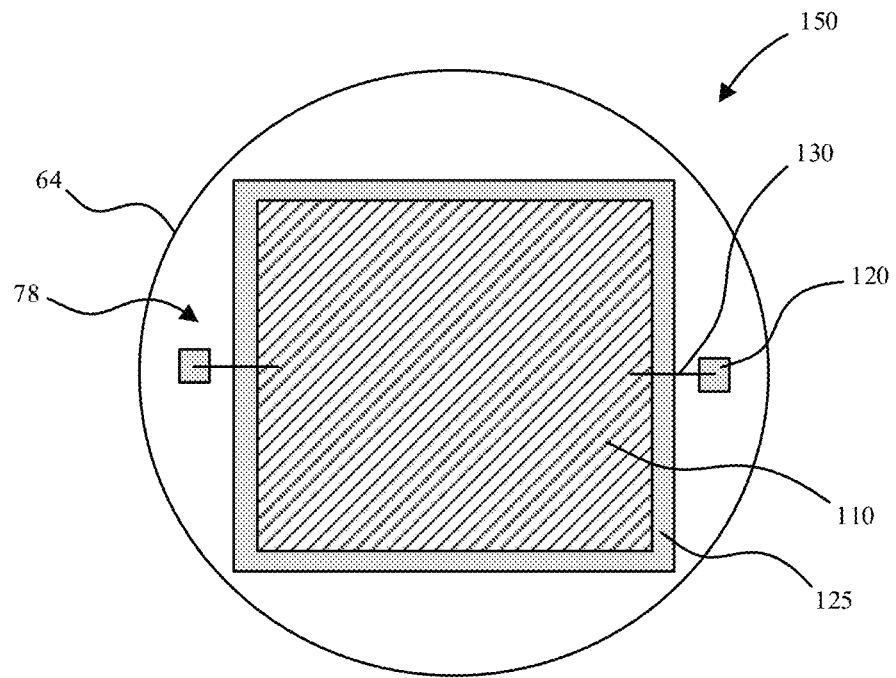
FIGS. 5-6 illustrate enlarged views of detector assemblies including rectangular and non-rectangular dies in accordance with embodiments.
Figure 6:
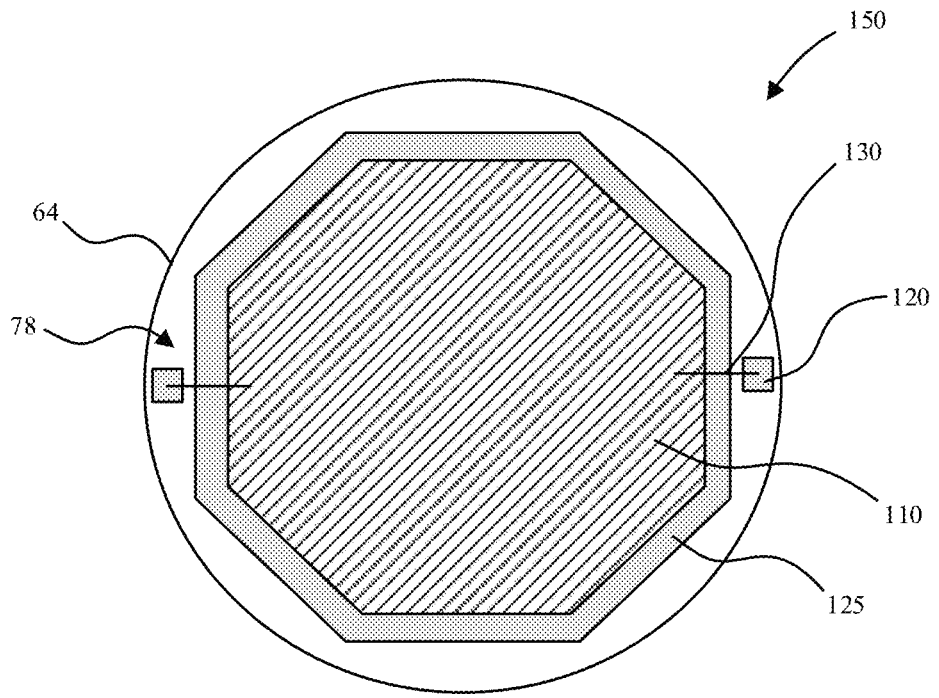

In order to further illustrate performance of the non-rectangular dies in accordance with embodiments, enlarged top plan view illustrations are provided in FIGS. 5 and 6 of detector assemblies 150 including a rectangular photodiode 110 in FIG. 5 compared to a non-rectangular photodiode 110 in FIG. 6. Referring to FIG. 5, where a rectangular photodiode 110 (or any optoelectronic device described herein) is mounted within a circular opening 64 of an isolation barrier 54 there is wasted (or unused) space 78 between the photodiode 110 and the adjacent wall of the circular opening 64. Referring to FIG. 6, this space 78 can be reduced with a non-rectangular photodiode 110 such as, but not limited to, the illustrated octagon shaped photodiode 110. Furthermore, surface area of the photodiode 110 can be increased, which reduces the optically dead zone corresponding to space 78 within opening 64. Additionally, after mounting the cover 52, this may further reduce an amount of overlap of the photodiode 110 outside of window 60. For example, where window 60 has a smaller area than the opening 64, and window 60 additionally has a smaller area than the top surface of photodiode 110. However, this arrangement is not required, and the window 60 may have a similar, or larger area than the photodiode 110.

Figure 7:
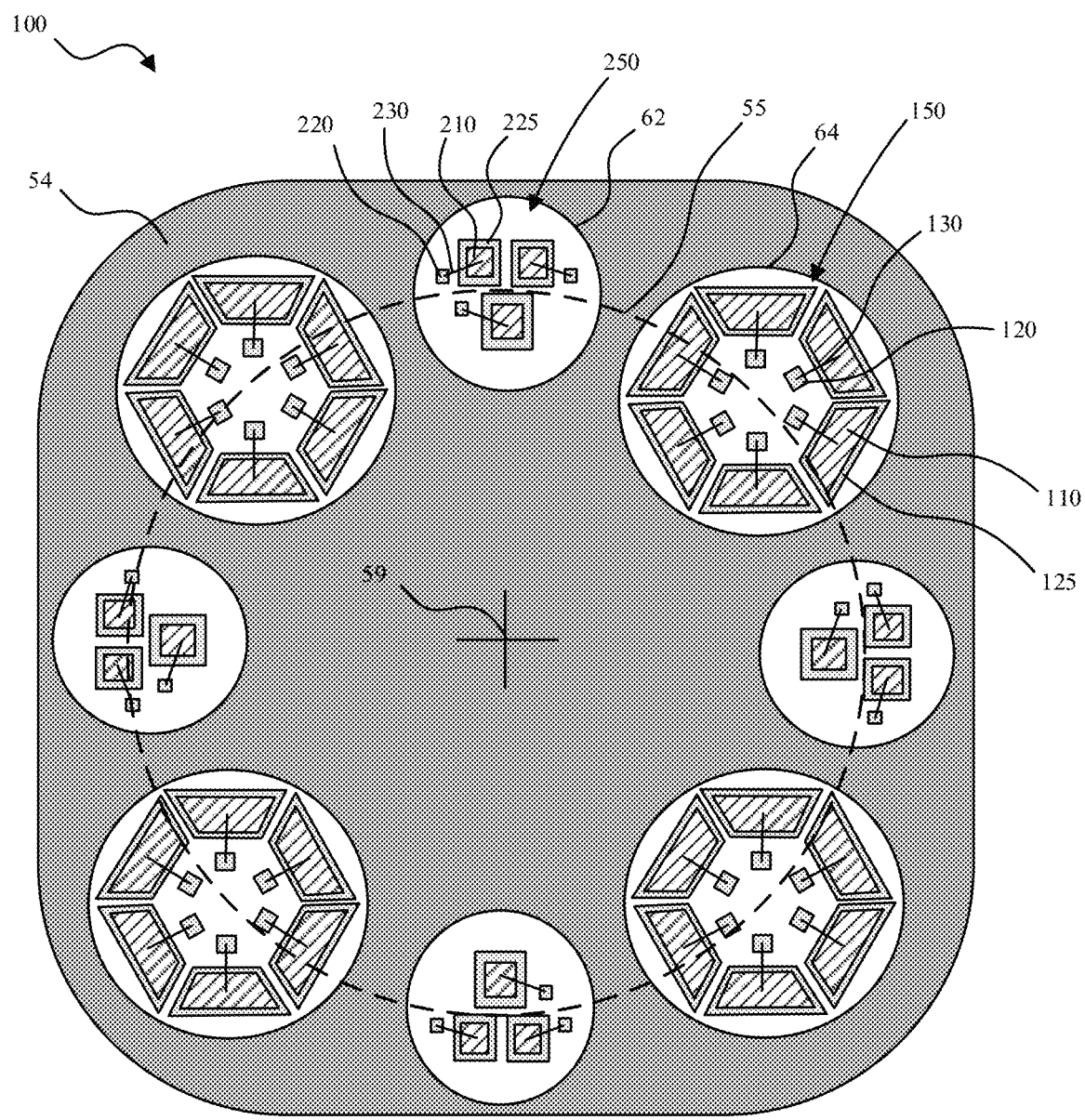
FIG. 7 illustrates a top plan view of an optoelectronic module in accordance with an embodiment.
Figure 8:
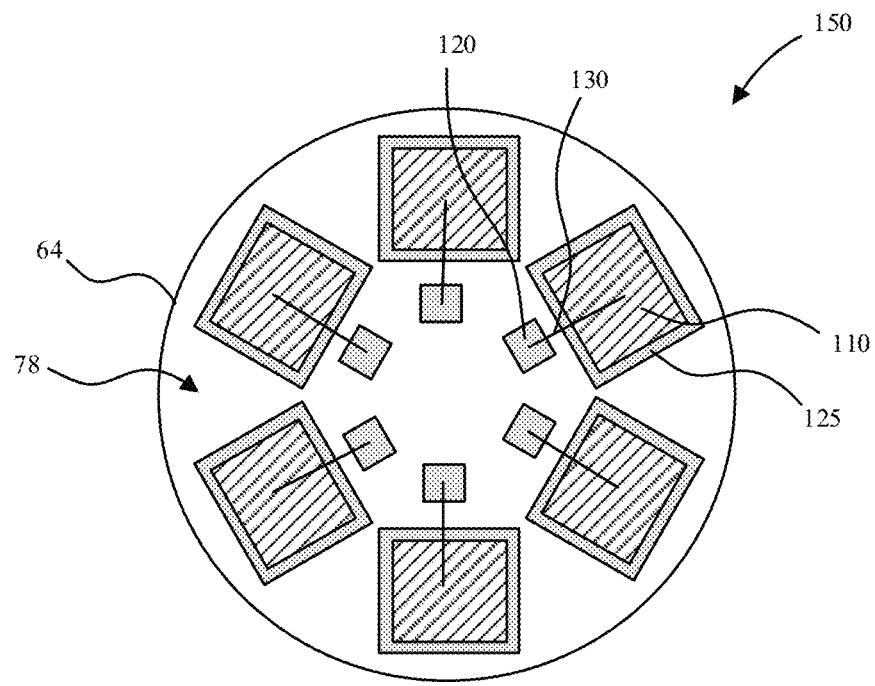
FIGS. 8-9 illustrate enlarged views of detector assemblies including rectangular and non-rectangular dies in accordance with embodiments.

Referring now to FIG. 7 a top plan view illustration of an optoelectronic module 100 similar to FIG. 4 is provided in accordance with an embodiment. As shown, one difference is with the inclusion of multiple photodiodes 110 within a detector assembly 150. More specifically, the photodiodes 110 may be non-rectangular shaped, such as a trapezoid, and can be further arranged in configurations that increase surface area use.

Each trapezoid-shaped photodiode 110 may include an outer edge 124 (or sidewall), a shorter inner edge 122 (or sidewall), and two side edges 126, 128 (or sidewalls) connecting together the ends of the edges 122, 124, to form a trapezoid. When more than one trapezoid-shaped photodiode 110 is mounted to the base, the photodiodes may be mutually oriented with side edges 126, 128 parallel to each other, which is a configuration that may improve the efficient use of the surface area of the detector assembly 150. The plurality of photodiodes 110 can also be equidistantly spaced from each other.

When a plurality of photodiodes 110 are arranged together, they may be positioned in a circular arrangement, e.g., located on a circle 136 having a center 138, and may be equidistant from the center 138. More specifically, photodiodes 110 can be arranged in a ring pattern.

Figure 10A:
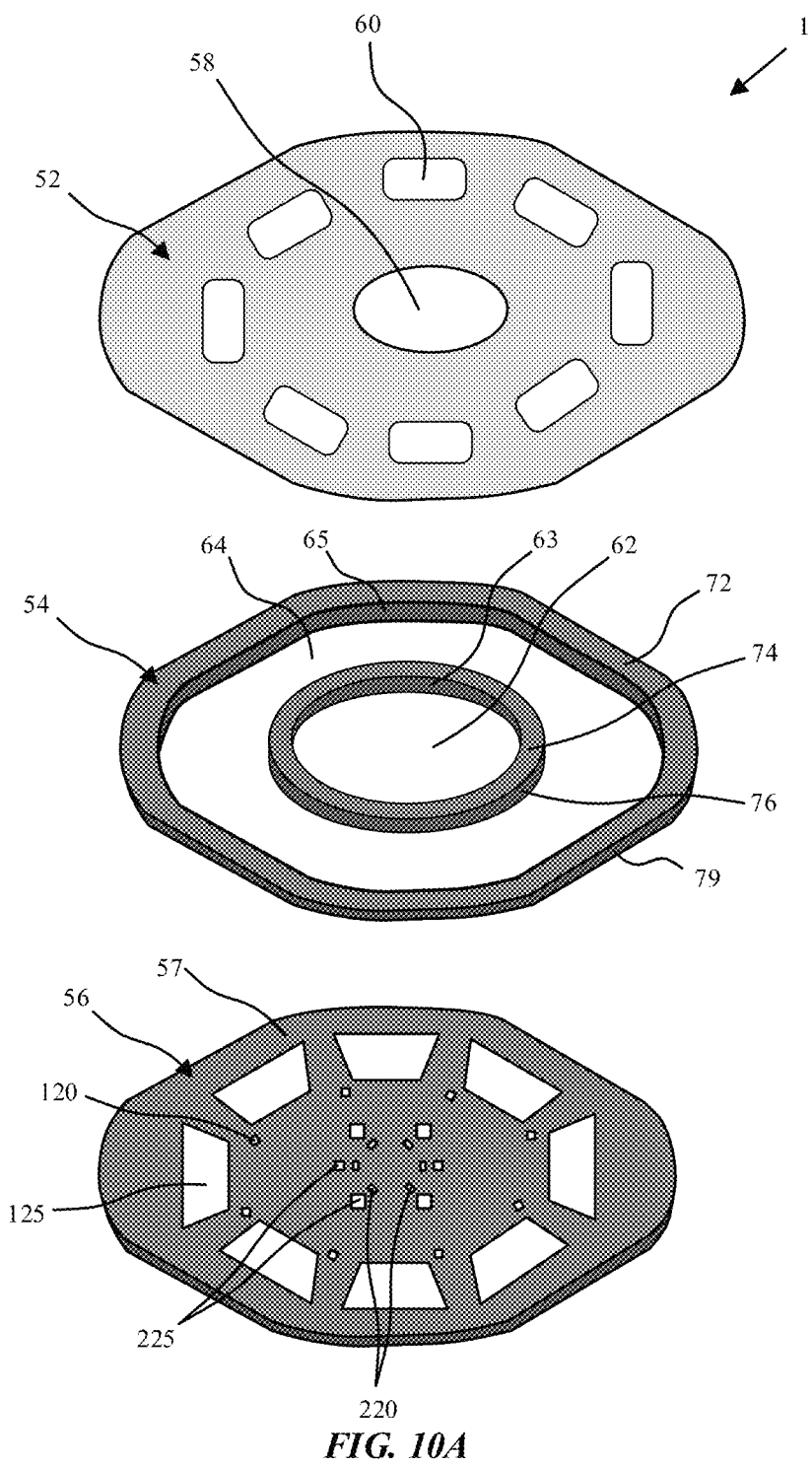
FIG. 10A illustrates an exploded view of an optical module stack up in accordance with an embodiment.
Figure 10B:
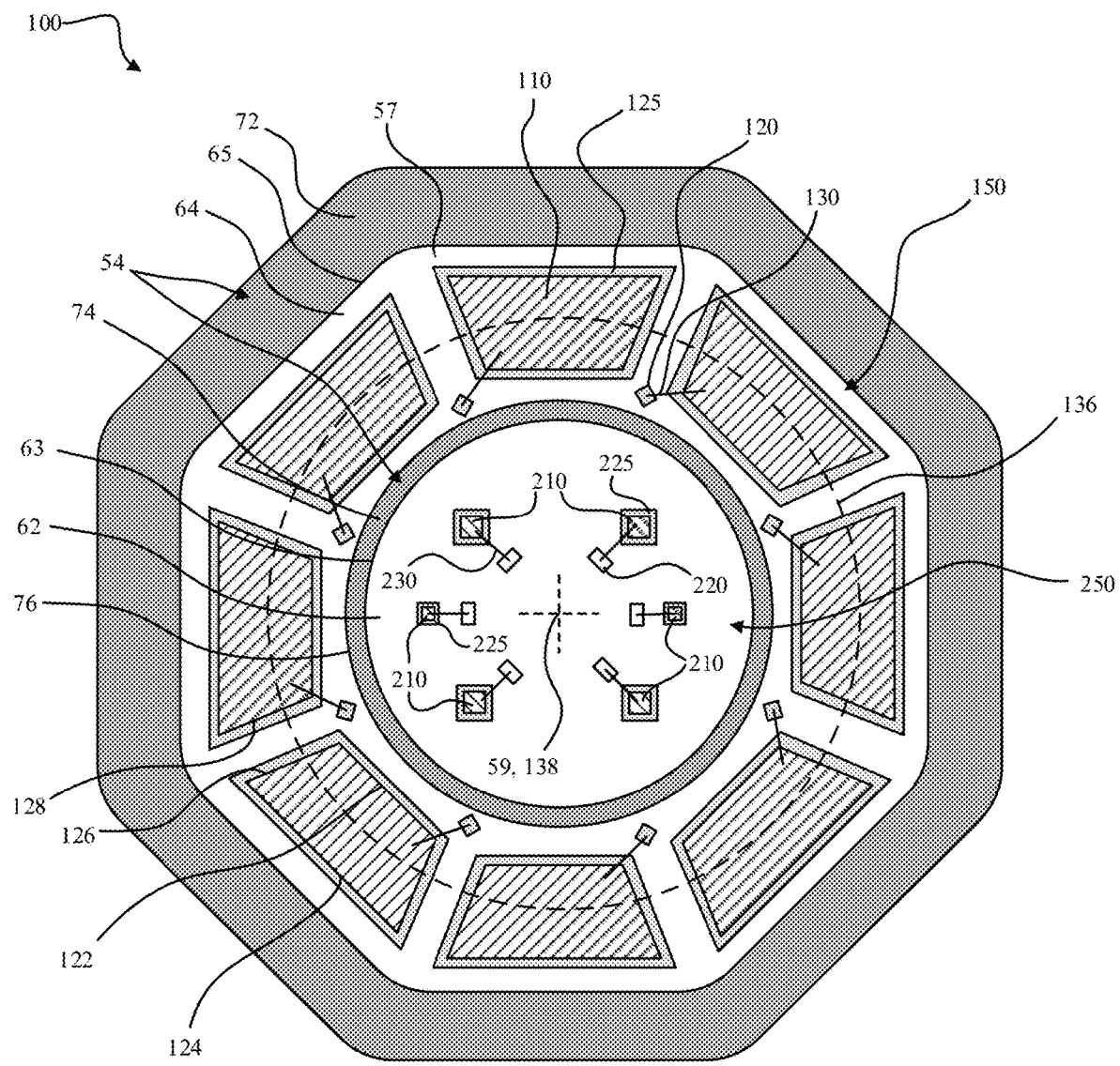
FIG. 10B illustrates a top plan view of an optical module in accordance with an embodiment.

Referring now to FIGS. 10A-10B, FIG. 10A illustrates exploded view of an optical module 100 stack up in accordance with an embodiment similar to FIG. 3, and FIG. 10B illustrates a top plan view of an optoelectronic module 100 similar to FIGS. 4 and 7 in accordance with an embodiment. Similar to previous descriptions, the optical module 100 may include a cover 52, an isolation barrier 54, and a base 56 such as a printed circuit board (PCB). Also, similar to module 100 of FIG. 7, the detector assembly 150 may include a plurality of non-rectangular shaped photodiodes 110 arranged in a ring shape. In interest of clarity and conciseness the following description focuses on differences or significant features of the optical module. Some notable differences from previously described embodiments include an optical module 100 arrangement in which a detector assembly 150 surrounds an emitter assembly 250. As shown, the emitter assembly 250 can be located inside a ring shaped detector assembly 150. This may be facilitated by a multiple piece isolation barrier 54. In the illustrated embodiment, the isolation barrier includes an outer frame 72, and an inner optical barrier 74.

In an embodiment, the outer frame 72 includes the opening 64 and sidewalls 65. The outer frame 72 may include an outer sidewall 79 and inner sidewall 65. The outer sidewall 79 and inner sidewall 65 may have similar or the same contours, which can have a different dimension(s). For example, the outer frame 72 can be ring shaped, or annular. The inner optical barrier 74 can also include an opening 62 with inner sidewalls 63 and outer sidewalls 76. The outer sidewall 76 and inner sidewall 63 may have similar or the same contours, which can have a different dimension(s). For example, the inner optical barrier 74 can be ring shaped, or annular. Openings 64, 62 may have a same geometric center 138. Additionally, the detector assembly 150 may have a center 59, which is the same as the geometric center 138. Similarly, the emitter assembly 250 may optionally have the same center 59.

Figure 9:
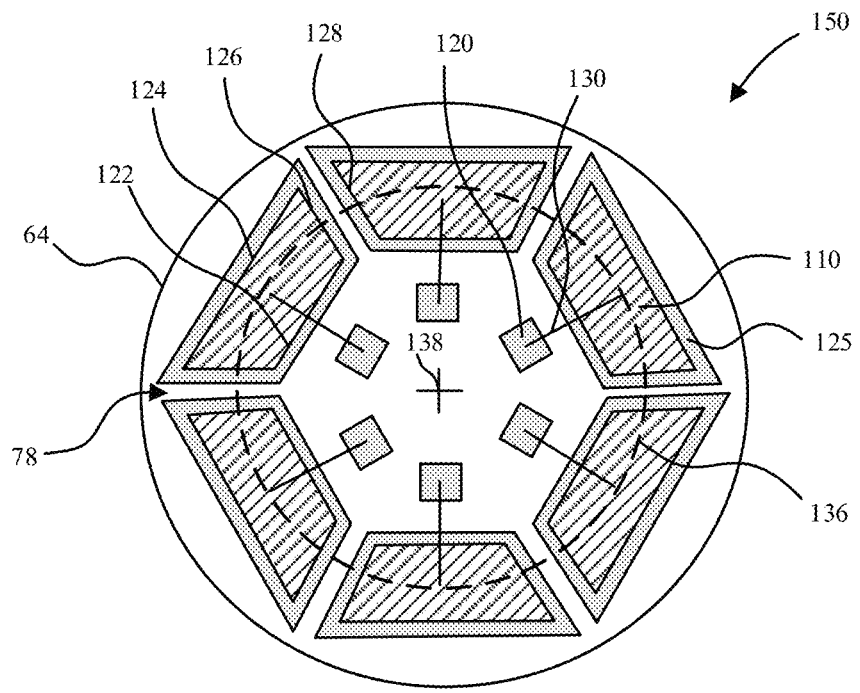

Similar to the embodiments illustrated in FIG. 7 and FIG. 9, the detector assembly 150 may include a plurality of photodiodes 110 arranged in a ring shaped pattern between the outer frame 72 and the inner optical barrier 74. The photodiodes 110 may be equidistantly spaced from a geometric center 138 of the opening 64, which may be the center of circle 136. The photodiodes 110 may have a variety of shapes such as isosceles trapezoid, a regular hexagon, an irregular hexagon, a regular octagon, a triangle, a disk, a sector, etc. In an embodiment, the photodiodes each have a quadrilateral shape, such as a trapezoid. A trapezoid in particular may be selected in order to achieve the ring shaped pattern and increase surface area use. Furthermore, a trapezoid can be formed using traditional wafer dicing (e.g. blade) techniques.

Each trapezoid-shaped photodiode 110 may include an outer edge 124 (or sidewall), a shorter inner edge 122 (or sidewall), and two side edges 126, 128 (or sidewalls) connecting together the ends of the edges 122, 124 to form a trapezoid. When more than one trapezoid-shaped photodiode 110 is mounted on the top surface 57 of base 56, the photodiodes may be mutually oriented with side edges 126, 128 parallel to each other, which is a configuration that may improve the efficient use of the surface area of the detector assembly 150, and facilitate placing the photodiodes 110 equidistantly spaced from each other, though trapezoid-shaped is not required for equidistant spacing. When a plurality of photodiodes 110 are arranged together, they may be positioned in a circular arrangement, e.g., located on a circle 136 having a center 138, and may be equidistant from the center 138. More specifically, photodiodes 110 can be arranged in a ring pattern. Additionally, the long edges 124 of the photodiodes 110 may face the inner sidewall 65 of opening 64, and the short edges 122 of the photodiodes 110 may face the outer sidewall 76 of the inner optical barrier 74, as well as center 138.

Referring to FIG. 10B, the emitter assembly 250 can be located within the opening 62 defined by the inner optical barrier 74, and the detector assembly is located within the opening 64 defined by the outer frame 72, and between the outer frame 72 and the inner optical barrier 74. The emitter assembly 250 may be similarly arranged as other descriptions herein, including arrangement in a circle with center.

Referring again to FIG. 10A along with FIG. 10B, the windows 60 of cover 52 may be aligned directly over the photodiodes 110 mounted onto the bond pads 125 of base 56. In an embodiment, each window 60 has smaller area than a corresponding photodiode 110. Window 58 may be aligned directly over one or more of the LEDs 210 of the emitter assembly 250.

It is to be appreciated additional components can be included within the optical module 100 stack ups described herein, such as lenses, bandpass filters, various sensors, etc.

In accordance with embodiments described herein, an optoelectronic module 100 may include a base 56 having a top surface 57 including a plurality of bond pads 125, 225, and an isolation barrier 54 arranged over the top surface 57. The isolation barrier 54 may include one or more openings 64, 62 such that a first opening 64, 62 is positioned over a set of one or more bond pads 125 of the plurality of bond pads 125, and a set of one or more non-rectangular shaped dies (e.g. photodiodes 110 or LEDs 210) is mounted on the set of one or more bond pads and located laterally adjacent to sidewalls 65, 63 of the first opening. For example, the dies may be photodiodes 110, though arrangements can also be provided for LEDs 210.

Referring specifically to FIGS. 7 and 9-10B, the photodiodes 110 may be arranged in a ring pattern. The photodiodes 110 may be equidistantly spaced from a geometric center 138 of the opening 64. The photodiodes 110 may have a variety of shapes such as isosceles trapezoid, a regular hexagon, an irregular hexagon, a regular octagon, a triangle, a disk, a sector, etc. In an embodiment, the photodiodes each have a quadrilateral shape, such as a trapezoid. A trapezoid in particular may be selected in order to achieve the ring pattern. Furthermore, a trapezoid can be formed using traditional wafer dicing (e.g. blade) techniques.

In a particular embodiment, each trapezoid shaped photodiode 110 includes a long edge 124 parallel to a short edge 122, with the long edge 124 facing a sidewall 65 of the opening 64, and the short edge 122 facing a center 138 of the opening 64. In an embodiment, the short edge 122 faces an outer sidewall 76 of inner optical barrier 74 of the isolation barrier 54. Each trapezoid can additionally include side edges 126, 128, with each side edge parallel to a side edge of an adjacent photodiode 110. This can facilitate placing the photodiodes 110 equidistantly spaced from each other.

In a particular embodiment, the ring pattern allows location of the plurality of wire bond pads 120 to be inside the ring shaped pattern. As shown, a plurality of wires 130 connect the top surfaces of the plurality of photodiodes 110 to the plurality of wire bond pads 120. The ring shaped pattern can also allow the arrangement of an emitter assembly to be located inside the ring shaped pattern.

In accordance with embodiments, a cover 52 can be located over the isolation barrier 54, and include windows 60 aligned over one or more openings 64 in the isolation barrier 54. In an embodiment, a window 60 may have a smaller area than the opening 64. In an embodiment, the window 60 may have a smaller area than a non-rectangular shaped photodiode 110 in the opening 64. For example, referring again to FIG. 5 a circular window 60 may be arranged directly over the rectangular photodiode 110 such that the underlying rectangular shape is not visible. Such an arrangement however may underutilize area of the photodiode 110. A non-rectangular shaped photodiode 110 such as that illustrated in FIG. 6, assuming same circular window 60 area can reduce the amount of underutilized area of the photodiode 110. This can increase efficiency. Furthermore, the non-rectangular shape may have an aesthetic appeal, which in this case may allow for a larger window 60. In an embodiment, the photodiode 110 includes six or more edges, such as the illustrated octagon, or is round, or circular. Referring now to the ring shape arrangements in FIGS. 7 and 9-10B, this may also have a similar aesthetic appeal relative to rectangular photodiodes 110. Including a plurality of photodiodes 110 can reduce power for each photodiode 110. Each photodiode 110 in the opening 64 can have a same composition for detection of same wavelength range, or different photodiodes can be arranged together to absorb multiple spectrums. In an embodiment, the entire ring shape arrangements of photodiodes 110 fits directly under the area of the window 60. However, the outside perimeter of edges 124 may be outside of the window 60. Thus, the outside perimeter established by edges 124 may have a larger area than that of the window. In an embodiment, such as that illustrated in FIGS. 10A-10B, a separate window 60 may be arranged over each corresponding photodiode 110. Thus, the windows 60 may also be arranged in a circular arrangement.

While the above description has been provided specifically with regard to photodiodes 110, such arrangements can also be applicable with LEDs 210 and emitter assemblies 250 in accordance with embodiments.

Figure 11A:
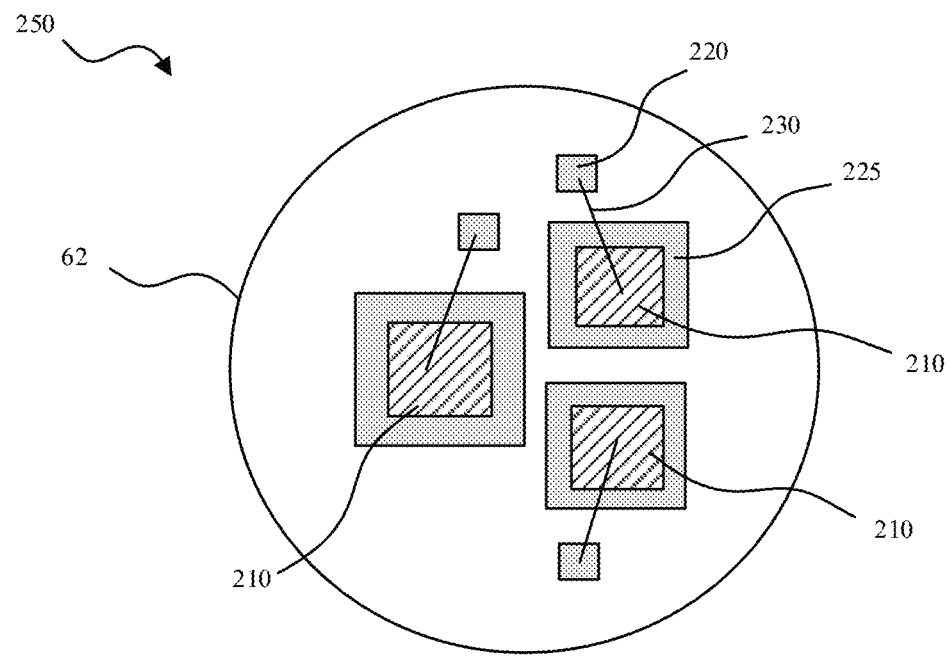
FIGS. 11A-13 illustrate top plan views of emitter assemblies including non-rectangular dies in accordance with embodiments.

FIG. 11A illustrates an emitter assembly 250 including a plurality of LEDs 210. Because of the rectangular shape of the LEDs 210, when used with a non-rectangular base, however, emitter assembly 250 does not maximize the available surface area of opening 62, and thus potential efficiency of the emitter assembly is not realized.

Figure 11B:
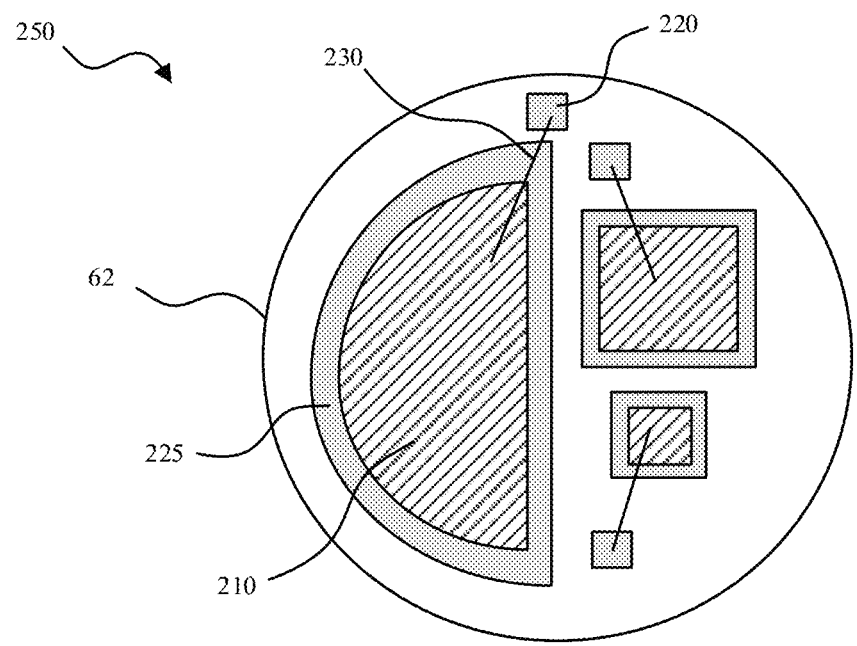

FIG. 11B illustrates an embodiment of an emitter assembly 250 including a non-rectangular shaped emitter. One or more of the LEDs 210 may have a non-rectangular shape which may improve on the utilization of the surface area of the emitter assembly 250, thus improving the overall emission performance. In the illustrated embodiment, one emitter 210 is formed as a half-disk, which may reduce unused surface area within opening 62. Some or all the LEDS 210 may be formed in non-rectangular shapes described herein, using any process, including those described herein.

Figure 12:
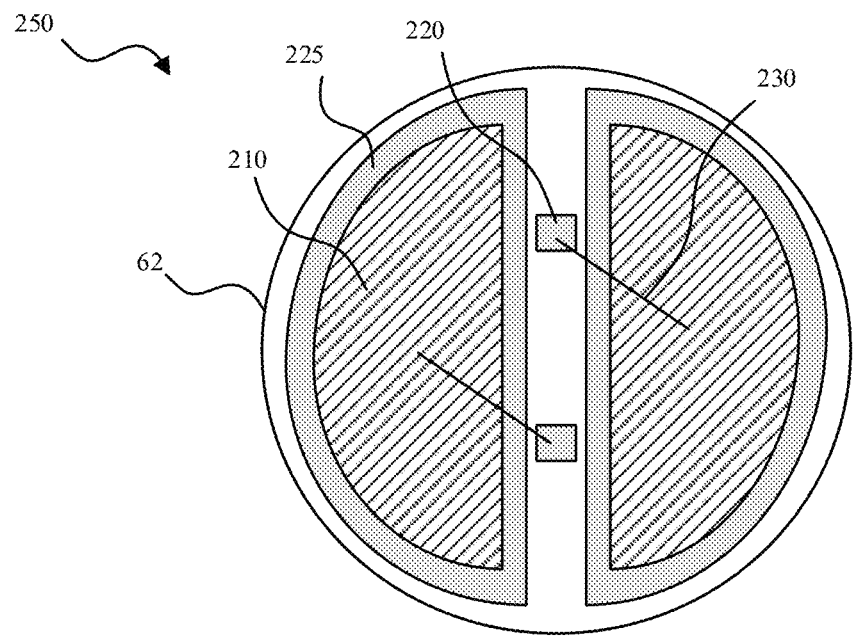
Figure 13:
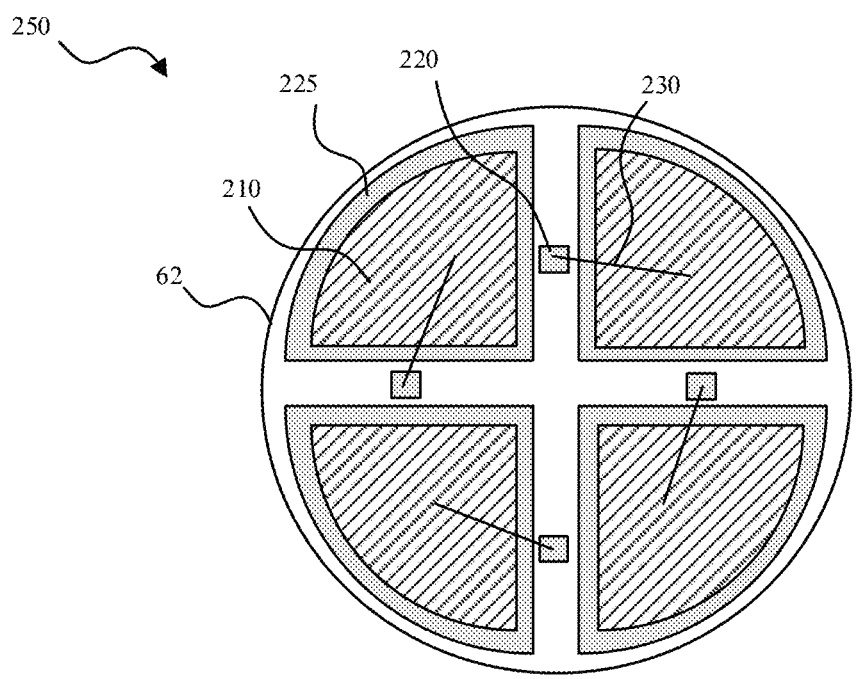

FIG. 12 illustrates yet another embodiment of an emitter assembly 250. As illustrated the emitter assembly 250 may include two sector-shaped, e.g., half-disk shaped, LEDs 210. The size, e.g., radius of one or both of the LEDs 210 may be selected to minimize the wasted surface area within opening 62, e.g., by making the radius of one or both of the devices nearly the same as that of the circular opening 62. An expansion and extension of the embodiment of FIG. 12 is illustrated in FIG. 13, in which more than two (here, four) sector- or quadrant-shaped (i.e., "pie slice" shaped) optoelectrical devices (LEDs 210) are arranged with the tip of each sector near the geometric center of the base. Embodiments are not limited to four sector-shaped devices and may include five or more such devices in the same or similar configuration. As will be readily appreciated, each of the optoelectrical devices of the embodiments of FIGS. 12 and 13 may be an emitter at any wavelength band or a photodetector. One example may include devices being emitters (e.g. LEDs 210) or detectors (e.g. photodiodes 110), and in general terms, may include alternating emitters and detectors. In more general terms, there may be any number of emitters and photodetectors, from zero to n, where n is the total number of devices mounted to the base, in any arrangement. As with the embodiment of FIG. 12, the radius of one or more of the sector-shaped devices may be nearly the same as that of the circular opening 62.

FIG. 14A illustrates a plan view of a traditional wafer dicing technique to form rectangular, e.g., square, dies, in which two perpendicular sets of parallel cuts are used to make square and rectangular photodiodes with high wafer utilization. A wafer 300, which may be roughly circular, is diced by forming cut lines (also referred to herein as cuts) in the wafer. The cuts are formed in two sets of parallel lines, a first set of parallel lines 302 and a second set of parallel lines 304. An angle 306 is formed between the lines of the two sets, which in the traditional method is set to 90 degrees, i.e., the first set of parallel lines 302 is orthogonal (perpendicular) to the second set of parallel lines 304. By setting the angle 306 to 90 degrees, the individual dies which are diced from the wafer 300 are rectangular, and by making the distance between lines in both sets constant and equal, the dies are square.

FIG. 14B illustrates a plan view of an embodiment of wafer dicing similar in some respects to that of FIG. 14A, but which produces non-rectangular dies. By forming the angle 306 between the sets of parallel lines 302, 304 to be other than 90 degrees, die 308 with a non-rectangular shape are formed. In the example of FIG. 14B, with the distance between the sets of parallel lines 302, 304 equal, die 308 is a parallelogram with equal-length sides. If the distance between the sets of parallel lines 302, 304 is not equal, then die 308 is a rhomboid with adjacent sides which are not equal in length. Both shapes may also be referred to as a diamond shape.

FIG. 15 illustrates a plan view of a first embodiment of multi-axis wafer dicing process. A wafer 310, which may be generally circular or other shapes, may be diced along three sets of parallel lines 312, 318, and 320. First set of parallel lines 312 may define a first interline distance 314, that is, a first distance between adjacent lines within the set 312, and may define a second interline distance 314, that is, a second distance between adjacent lines within the set 312. Distances 314 and 316 may be the same or different. In an embodiment illustrated in FIG. 15, distances 314 and 316 are not equal, for reasons described in greater detail below.

Lines of first set 312 form an angle 322 with lines of second set 318. According to an embodiment, angle 322 is less than 90 degrees. Lines of first set 312 form an angle 324 with lines of third set 320. According to an embodiment, angle 324 is less than 90 degrees. Lines of second set 318 form an angle 332 with lines of third set 320. According to an embodiment, angle 332 is less than 90 degrees. In general terms, each of the angles 322, 324, 332 may be equal to 90 degrees or not, depending on the shapes of the dies to be formed from the wafer 310. By dicing wafer 310 with three sets of lines, several non-rectangular shaped dies may be formed. More specifically, with continued reference to FIG. 15, dies having the shape of trapezoids 326, hexagons 328, and triangles 330 may be formed. Setting distance 314 not equal to distance 316 causes dimensions of some or all the non-rectangular shaped dies to change.

Figure 16:
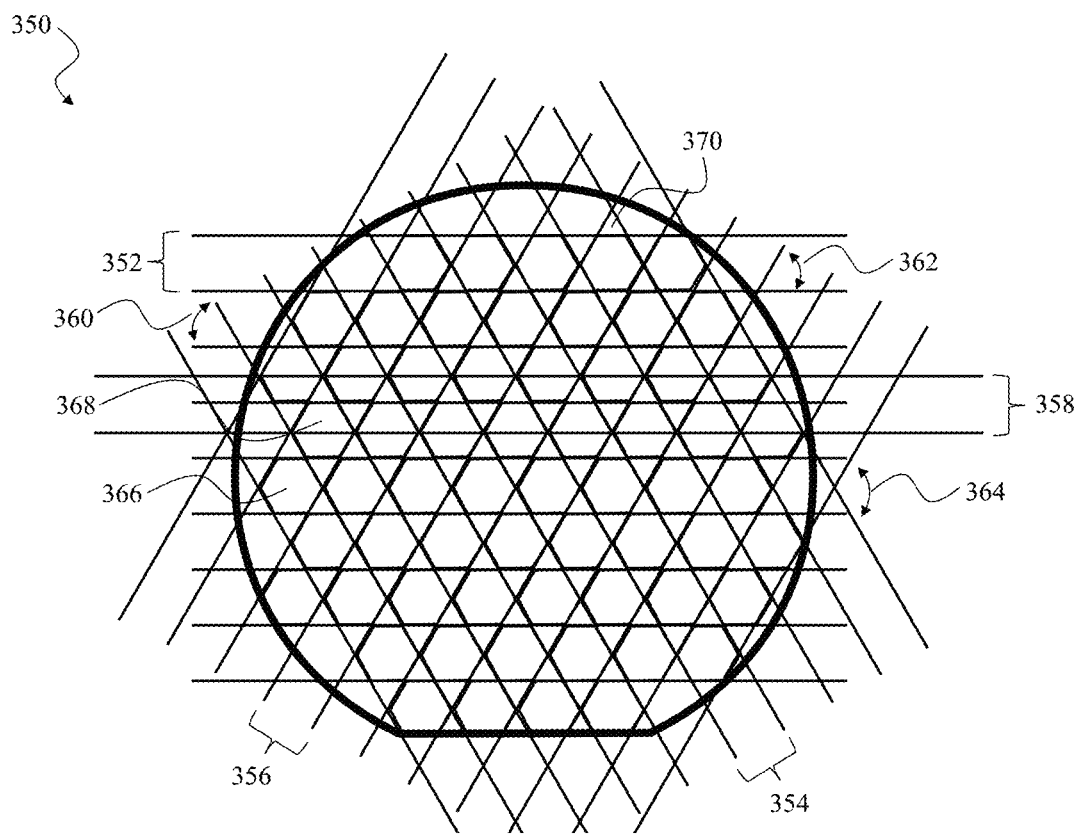
FIG. 16 illustrates a top plan view of a second embodiment of a wafer cutting pattern incorporating multi-axis wafer dicing to produce non-rectangular dies.

FIG. 16 illustrates a plan view of a second embodiment of multi-axis wafer dicing. A wafer 350, which may be generally circular or other shapes, may be diced along three sets of equidistant, parallel lines 352, 354, 356. An optional fourth set of equidistant, parallel lines 358 may also be used, parallel to and equidistant between the lines of the first set 352, for reasons detailed elsewhere herein. Dicing the wafer 350 along the set of parallel lines 358 may be equivalent to narrowing the distance between lines of the set of parallel lines 352 by half. As with the embodiment of FIG. 15, an angle 360 is formed between the lines of the first set 352 and the second set 354; an angle 362 is formed between the lines of the first set 352 and the third set 356; and an angle 364 is formed between the lines of the second set 354 and the third set 356. Mutual selection of the angles 360, 362, and 364, and the distances between each line in the sets of parallel lines 352, 354, 356, may result in wafer 350 being diced into dies having non-rectangular shapes. In an embodiment, dies cut from wafer 350 may have hexagon 366, trapezoid 368, and/or triangular 370 shapes. In an embodiment, when angles 360, 362, and 364 are the same, the wafer 350 may be diced into dies having regular hexagon and isosceles triangular shapes. When wafer 350 is diced along sets of parallel lines 352, 354, 356, and along at least one line from set of parallel lines 358, trapezoid-shaped dies may be formed, by bisecting at least one set of hexagons 366 as can be seen in FIGS. 7 and 9-10B, for example. Set 358 can be one line, or many parallel lines bisecting some or all the hexagons 366.

Figure 17:
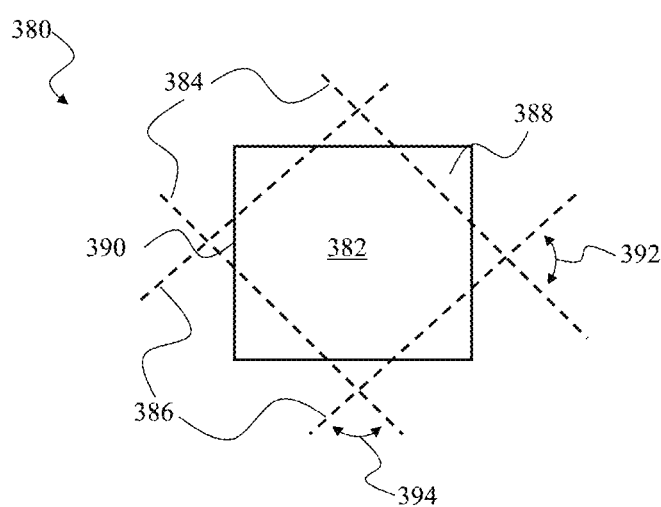
FIG. 17 illustrates a top plan view of a third embodiment of a wafer cutting pattern incorporating multi-axis wafer dicing to produce non-rectangular dies.

FIG. 17 illustrates a plan view of a third embodiment of multi-axis wafer dicing. FIG. 17 illustrates a portion of a wafer 380. Wafer 380 has been diced into square dies 382, using a method such as, for example, that described with reference to FIG. 14A. Additionally, however, wafer 380 may be diced along two additional sets of equidistant, parallel lines 384, 386, in such a way that the corners 388 of the square dies 382 are cut off and dies 382 becomes an octagon with eight sides 390. A regular octagon-shaped die may be formed from wafer 380 by making: the angles 392, 394 between the two sets of equidistant, parallel lines 384, 386 to be 90 degrees; the distance between lines in two sets of equidistant, parallel lines 384, 386 to be the same as each other and the same as the side of die 382 when square; orienting the two sets of equidistant, parallel lines 384, 386 at 45 degrees to the square die 382; and positioning the two sets of equidistant, parallel lines 384, 386 so that each corner 388 area is identical. Non-regular octagons may be formed as well, by not following one of the foregoing requirements.

Figure 18:
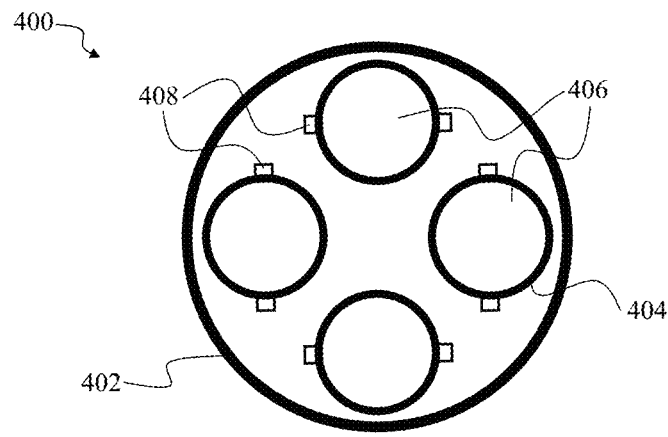
FIG. 18 illustrates a top plan view of a yet another embodiment of an optoelectronic device with non-rectangular dies.
Figure 19:
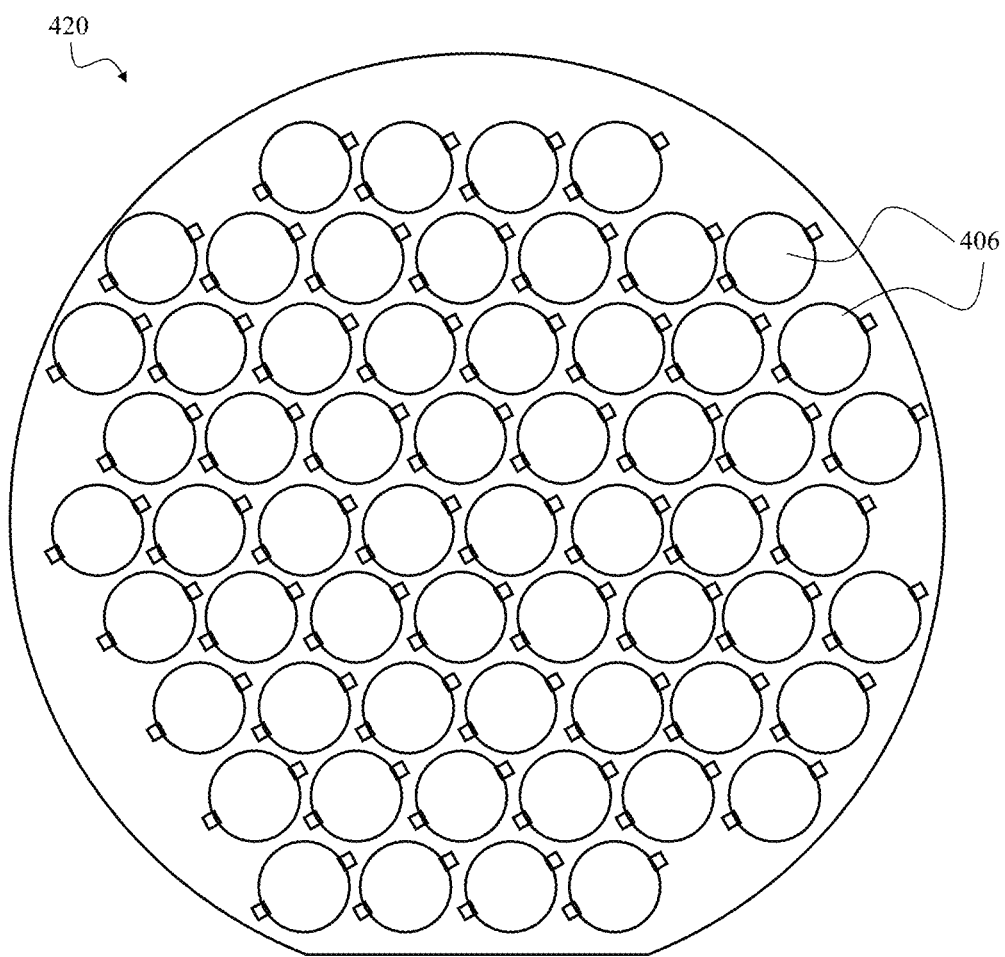
FIG. 19 illustrates a top plan view of another embodiment of a wafer cutting pattern to produce non-rectangular dies.

FIG. 18 illustrates another embodiment of the use of non-rectangular dies formed from a wafer. An optical module 400 may include a base 402, which may include or be a PCB, in or over which one or more circular openings 404 are formed; this may be accomplished by the further inclusion of an isolation barrier as described elsewhere herein. Openings 404 may be similar to openings 62, 64. One or more circular dies 406, e.g., optoelectrical devices, may be positioned within the one or more openings 404, which may be one die 406 in each opening 404. Each die 406 may have one or more electrical leads or wire bond pads 408 connecting the die to the base 402 or to other devices on the base (not illustrated). When optoelectrical devices, e.g., LEDs and photodiodes, take better advantage of the available space and allow an increase in the area used, an increase in transmitted and/or received signal level may be achieved. FIG. 19 illustrates a wafer 420 from which one or more dies 406 may be diced, for example using one or more of the processes described herein.

Figure 20:
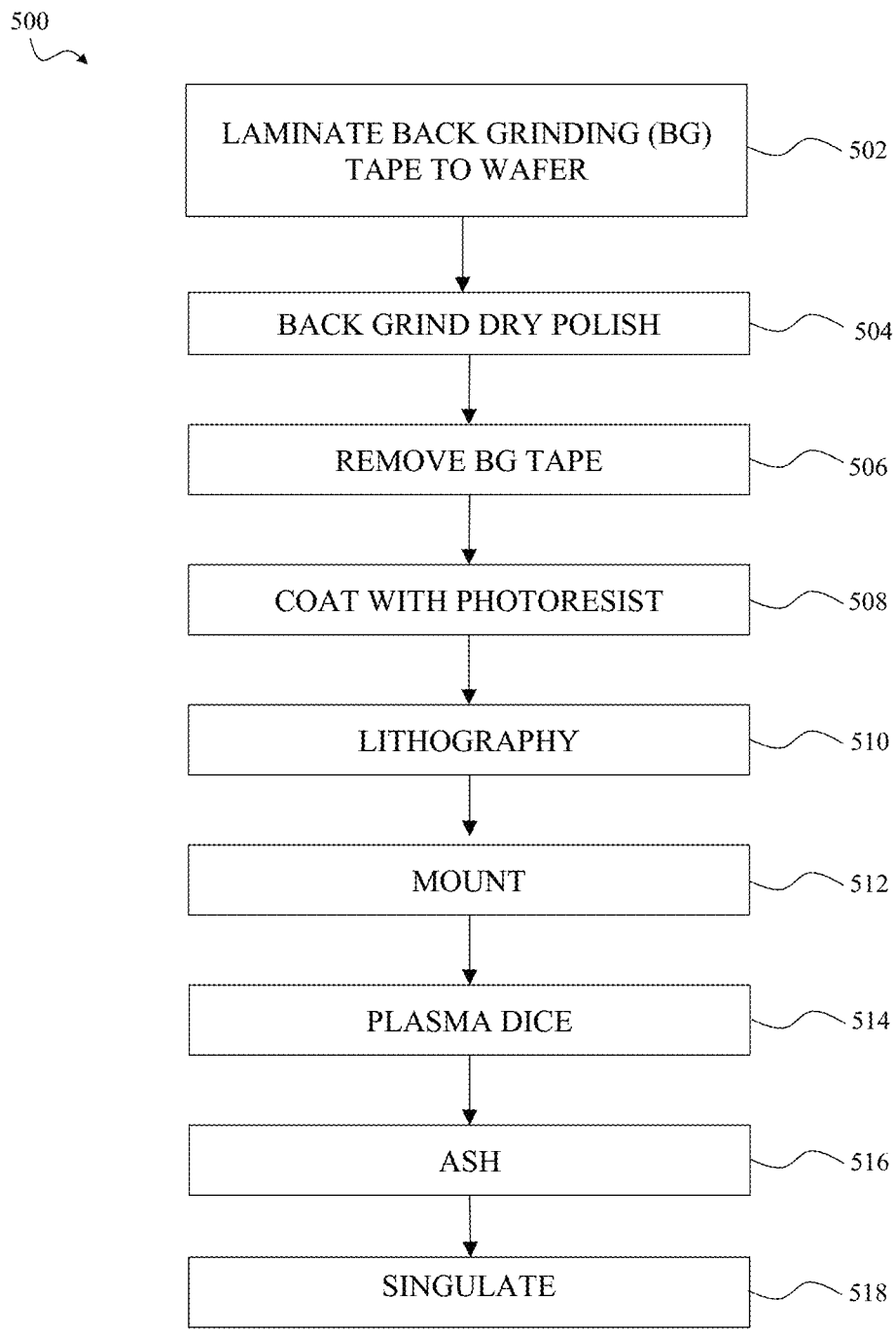
FIG. 20 illustrates a flow diagram of a wafer-dicing process.

Turning now to FIG. 20, an example process 500 of dicing a microelectronic device, such as, but not limited to, any of the optoelectronic devices described herein, from a wafer is illustrated and described. Process 500 may be, or include, a plasma dicing process, which may be or include a deep reactive-ion etching ("DRIE") etching process. In a first operation 502, a back grinding (BG) tape may be laminated to a surface of a wafer. In a second operation 504, which may follow operation 502, the wafer is back-ground and dry polished. In a third operation 506, which may follow operation 504, the BG tape may be removed. In a fourth operation 508, which may follow operation 506, the wafer may be coated with a photoresist material. In a fifth operation 510, which may follow fourth operation 508, lithography is performed on the wafer to form patterns in a known manner. In a sixth operation 512, which may follow fifth operation 510, the wafer is mounted to, e.g., a mounting tape. In a seventh operation 514, which may follow sixth operation 512, the wafer is plasma diced into individual dies, some or all of which may have non-rectangular shapes as described herein. In an eighth operation 516, which may follow seventh operation 514, the diced wafer is ashed, before the individual dies are singulated in ninth operation 518.

While some processes of forming non-rectangular dies have been described herein, other processes may be used, including scribe-and-breaking, plasma cutting, laser cutting, stealth dicing, sawing, and any combinations thereof.

In utilizing the various aspects of the embodiments, it would become apparent to one skilled in the art that combinations or variations of the above embodiments are possible for forming an optoelectronic device with non-rectangular shaped LEDs and/or photodiodes. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An optoelectronic module comprising:
a base having a top surface including a plurality of bond pads;
an isolation barrier arranged over the top surface, wherein the isolation barrier includes one or more openings, such that a first opening of the one or more openings is positioned over a set of one or more bond pads of the plurality of bond pads; and
a plurality of non-rectangular shaped dies mounted on the set of one or more bond pads, and located laterally adjacent to sidewalls of the first opening;
wherein each of the non-rectangular shaped dies includes an inner edge facing a center of the first opening and an outer edge facing the sidewalls of the first opening such that the plurality the plurality of non-rectangular shaped dies is arranged in a ring pattern;
a plurality of wiring bond pads located inside of the inner edges toward the center; and
a plurality of wires connecting the plurality of non-rectangular shaped dies to the plurality of bond pads.

2. The optoelectronic module of claim 1, wherein the non-rectangular shaped dies are equidistantly spaced from each other.

3. The optoelectronic module of claim 1, wherein the plurality of non-rectangular shaped dies includes one or more trapezoid shaped dies.

4. The optoelectronic module of claim 3, wherein:
the inner edges are shorter than the outer edges.

5. The optoelectronic module of claim 4, wherein the isolation barrier includes an outer frame and an inner optical barrier, wherein the plurality of non-rectangular shaped dies is between the outer frame and the inner optical barrier.

6. The optoelectronic module of claim 5, wherein the plurality of non-rectangular shaped dies is a plurality of photodiodes.

7. The optoelectronic module of claim 1, further comprising a cover over the isolation barrier, wherein the cover includes a window aligned over the first opening in the isolation barrier, wherein the window has a smaller area than the first opening.

8. The optoelectronic module of claim 1, further comprising a cover over the isolation barrier, wherein the cover includes a plurality of windows aligned over the plurality of non-rectangular shaped dies.

9. An optoelectronic module comprising:
a base having a top surface;
an emitter assembly on the top surface;
a detector assembly on the top surface; and
an isolation barrier arranged over the top surface, wherein the isolation barrier includes a first opening around the emitter assembly, and a second opening around the detector assembly;
wherein one of the detector assembly and the emitter assembly includes a plurality of non-rectangular shaped dies;
wherein each of the non-rectangular shaped dies includes an inner edge facing a center of the first opening and an outer edge facing sidewalls of the first opening such that the plurality the plurality of non-rectangular shaped dies is arranged in a ring pattern;
a plurality of wiring bond pads located inside of the inner edges toward the center; and
a plurality of wires connecting the plurality of non-rectangular shaped dies to the plurality of bond pads.

10. The optoelectronic module of claim 9, wherein the each of the non-rectangular shaped dies has a shape selected from the group consisting of an isosceles trapezoid, a regular hexagon, an irregular hexagon, a regular octagon, a triangle, a disk, and a sector.

11. The optoelectronic module of claim 10, wherein the plurality of non-rectangular shaped dies is a plurality of non-rectangular shaped photodiodes of the detector assembly.

12. The optoelectronic module of claim 11, further comprising a cover over the isolation barrier, wherein the cover includes a first set of one or more first widows over the first opening, and a second set of one or more second windows over the second opening.

13. The optoelectronic module of claim 12, wherein:
the plurality of non-rectangular shaped dies is a plurality of non-rectangular shaped photodiodes;
the second set of one or more second windows comprises a plurality of second windows arranged over the plurality of non-rectangular shaped photodiodes; and
each second window has a smaller area than a corresponding non-rectangular shaped photodiode.

14. The optoelectronic module of claim 13, wherein the isolation barrier includes an outer frame and an inner optical barrier, wherein the isolation barrier defines the first opening, and the outer frame defines the second opening, and the plurality of non-rectangular shaped photodiodes is between the outer frame and the inner optical barrier.

15. The optoelectronic module of claim 13, wherein each non-rectangular shaped photodiode is trapezoid shaped.

* * * * *